United States Patent [19]

Schairer

[11] Patent Number: 4,796,268
[45] Date of Patent: Jan. 3, 1989

[54] HETEROSTRUCTURE SEMICONDUCTOR LASER DIODE

[75] Inventor: Werner Schairer, Weinsberg, Fed. Rep. of Germany

[73] Assignee: Telefunken electronic GmbH, Heilbronn, Fed. Rep. of Germany

[21] Appl. No.: 4,860

[22] Filed: Jan. 12, 1987

[30] Foreign Application Priority Data

Feb. 12, 1986 [DE] Fed. Rep. of Germany ....... 3604293

[51] Int. Cl.[4] .............................................. H01S 3/19
[52] U.S. Cl. ........................................ 372/46; 372/45; 372/48; 372/49; 357/16; 357/17
[58] Field of Search ....................... 372/46, 45, 48, 49, 372/44; 357/17, 16

[56] References Cited

U.S. PATENT DOCUMENTS 4,625,223 11/1986 Komatsubara et al. ............... 357/17
4,701,926 10/1987 Seiwa et al. ............................ 372/48

FOREIGN PATENT DOCUMENTS 0115390 8/1984 European Pat. Off. .
0161691 8/1985 Japan .
2129212 5/1984 United Kingdom .

OTHER PUBLICATIONS

Claus Wölk et al., Criteria for Designing V-Groove Lasers, IEEE Journal of Quantum Electronics, vol. QE-17, No. 5, May 1981, pp. 756–759 and 759–762.

Primary Examiner—William L. Sikes
Assistant Examiner—Georgia Y. Epps
Attorney, Agent, or Firm—Spencer & Frank

[57] ABSTRACT

A heterostructure semiconductor laser diode with a sequence of layers, formed on a substrate, including a laser-active layer arranged between enclosing layers of opposite respectively conductivity types, a cover layer disposed on the side of the sequence of layers facing away from the substrate, and a layer of a conductivity type opposite to that of the substrate arranged between the substrate and the lower enclosing layer and having in the area of the plane of symmetry, a narrow strip produced by diffusion which has the same conductivity type as the substrate and penetrates into the area of the substrate. The current flowing in the forward direction of the semiconductor laser diode is thereby restricted to a narrow strip-shaped area of the laser-active layer.

19 Claims, 4 Drawing Sheets

HETEROSTRUCTURE SEMICONDUCTOR LASER DIODE

BACKGROUND OF THE INVENTION

The invention relates to a heterostructure semiconductor laser diode with a sequence of layers formed on a substrate, a laser-active layer arranged between enclosing layers of opposite conductivity type, and a cover layer disposed on the side of the sequence of layers facing away from the substrate.

A heterostructure semiconductor laser diode with a V-groove-shaped recess is known from German Pat. No. 2,822,146. The current flowing in the forward direction of the semiconductor laser diode is restrictred to a narrow strip-shaped area of the laser-active layer. The active area or strip is pumped up to the resonator mirrors. Heat is generated at the mirrors by surface recombination and the overpopulation in the valence or conduction band is simultaneously reduced. As a result, the directly generated heat together with the absorption induced by the absence of overpopulation cause a gradual degradation of the mirrors with relatively low output power. The thus produced laser structure is based on an n-conducting substrate.

SUMMARY OF THE INVENTION

The object underlying the present invention is, therefore, to provide a structure for a semiconductor laser diode which avoids a degradation of the mirrors and which exhibits a layer structure suitable for various epitaxy processes.

This object is attained in accordance with the invention by the features contained in the characterizing clause of claim 1 and in the further claims.

The fundamental advantage of the semiconductor laser structure according to the invention is that the efficiency is increased and a laser with higher output power and simultaneously improved long-term stability is attained.

Further advantageous embodiments of the invention are apparent from the subclaims.

Embodiments of the invention are illustrated in the Figures and are described in further detail hereinafter.

BRIEF DESCRIPTION OF THE DRAWINGS

FIG. 7b shows a longitudinal section taken through the laser structure of FIG. 7a;

FIG. 8b shows a longitudinal section taken through the laser structure of FIG. 8a.

DESCRIPTION OF THE PREFERRED EMBODIMENTS

Figure 1:
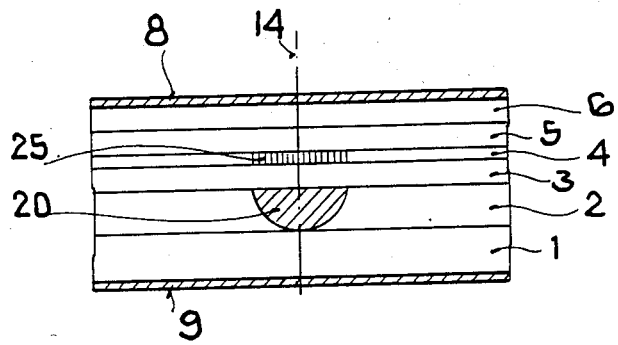
FIG. 1 shows the cross-section of a heterostructure semiconductor laser diode with the narrow strip 20 produced by diffusion.

FIG. 1 shows a substrate 1 consisting, for example, of GaAs which is preferably p-conducting and on which layers 2 to 6 are grown by means of known epitaxy processes. The layers with the reference numerals of FIG. 1 have the following composition:

1: GaAs substrate, p-type, p $\sim 10^{18}$ cm$^{-3}$ thickness d approximately 100 $\mu$m, orientation: (100)
2: GaAs or Ga$_{1-x}$Al$_x$As, n-type, n $\sim 5 \cdot 10^{17}$ cm$^{-3}$ d $\sim 3$ $\mu$m
3: Ga$_{1-y}$Al$_y$As, p-type, p $\sim 5 \cdot 10^{17}$ cm$^{-3}$, d $\sim 1$ $\mu$m
4: GaAs, undoped, d $\sim 0.1$ $\mu$m
5: Ga$_{1-x}$Al$_x$As, n-type, n $\sim 10^{17}$ cm$^{-3}$, d $\sim 2$ $\mu$m
6: GaAs, n-type, n $\sim 10^{18}$ cm$^{-3}$, d $\sim 0.5$ $\mu$m
9: ohmic contact: TiPt p-substrate
8: ohmic contact: Au-Ge alloy, n-side
In the chosen Example, x=x'=0.35 was selected.

The aluminum concentration and the stated doping values merely represent typical values. The layer sequence 3 to 5 corresponds together with the laser-active layer 4 to the known double heterostructure in which the laser activity occurs upon current injection.

Figure 6:
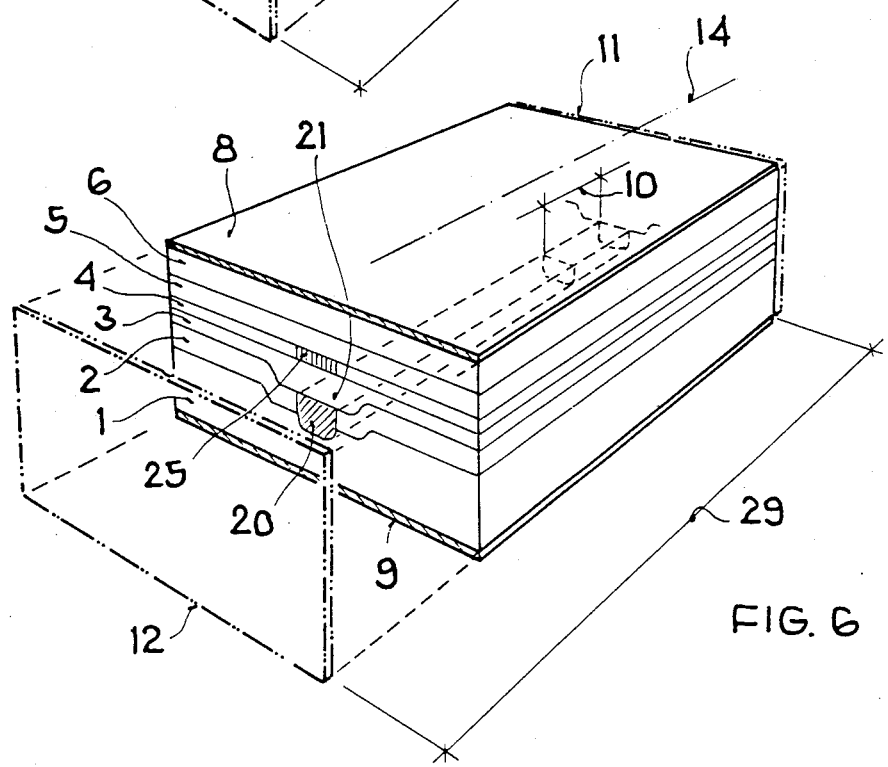
FIG. 6 is the perspective illustration of a heterostructure semiconductor laser diode with a cross-section according to FIG. 3, wherein the narrow strip 20 is shorter, symmetrically with the mirrors, than the resonator length 29 by the extent of the small area 10.

Novel in this laser structure is layer 2, in which there is produced, in the area of the plane of symmetry 14 by masking and diffusion, a p-doped narrow strip 20 which penetrates into the area of the substrate 1, whereby the current flowing in the forward direction of the semiconductor laser diode is restricted to a narrow strip-shaped area 25 (FIGS. 6, 7, 8).

Figure 2:
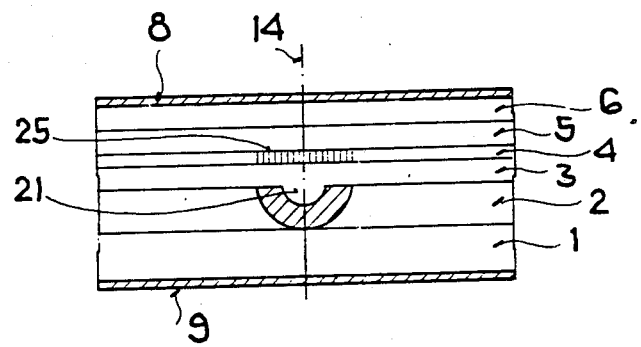
FIG. 2 shows the cross-section of a heterostructure semiconductor laser diode wherein the layer 2 is recessed by etching in the area of the plane of symmetry.

FIG. 2 shows a modification of a semiconductor laser structure apparent from FIG. 1, wherein layer 2 is recessed by, for example, etching in the area 21 of the plane of symmetry 14. An index guiding of the optical field is attainable by this measure.

Figure 3:
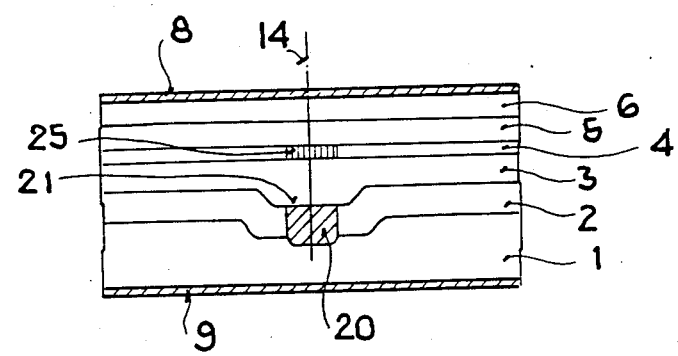
FIG. 3 shows the cross-section of a heterostructure semiconductor laser diode wherein the substrate is recessed by etching in the area of the plane of symmetry.

The cross-section of a semiconductor laser diode shown in FIG. 3 comprises a substrate 1 which is recessed, for example, by etching in the area 21 (FIG. 6) of the plane of symmetry 14. Further layers 2 to 6 are subsequently applied by epitaxy to this substrate, with the narrow strip 20 again being produced by masking and diffusion.

The so selected structure of substrate 1 results in the distance between the lower side of the laser-active layer 4 and the upper side of layer 2 being larger in the area of the plane of symmetry 14 than the thickness of the lower enclosing layer 3 in the area outside of the plane of symmetry 14. This measure also serves the index guiding of the optical field.

Figure 4:
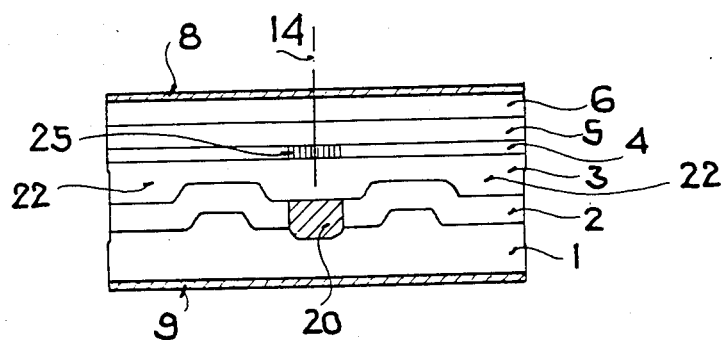
FIG. 4 shows the cross-section of a heterostructure semiconductor laser diode wherein the substrate is recessed by etching in the area of the plane of symmetry and at the edge zones.

FIG. 4 shows a modification of a semiconductor laser structure derivable from the structure of FIG. 3.

In addition to the recess of the substrate in the area 21 of the plane of symmetry 14, the edge zones 22 are also recessed in cross-section, which produces a levelling effect in the subsequently applied epitaxial layers.

The first decisive advantage of the semiconductor laser structures according to FIGS. 1 to 4 over the known V-groove laser structure is that a p-conducting substrate resulting in improved epitaxy quality is used.

A further advantage is that in order to increase the near field stability, in addition to the gain guiding, a component of the index guiding can be introduced. The structures illustrated in FIGS. 2 to 4 are provided therefor. These are made by LPE (Liquid Phase Epitaxy), with non-planar structures being levelled in the course of the epitaxy process.

If the advantages of the MBE or OM-VPE epitaxy processes ( MBE=Molecular Beam Epitaxy; OM-VPE=Organo Metallic Vapor Phase Epitaxy ) are to be exploited, the structures illustrated in FIGS. 7a, 7b and 8a, 8b are recommended.

A much more important advantage is that non-absorbing mirrors which are the essential precondition for attaining very high laser powers are realizable, at the same time, and, without ay extra expenditure, with these structures and epitaxy processes.

Figure 5:
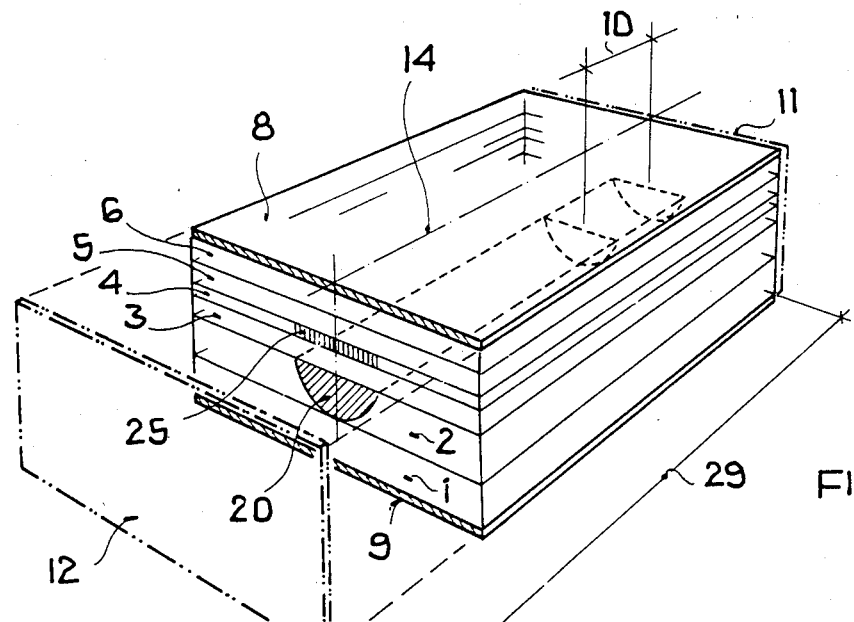
FIG. 5 is the perspective illustration of a heterostructure semiconductor laser diode with a cross-section according to FIG. 1, wherein the narrow strip 20 is shorter, symmetrically with the mirrors, than the resonator length 29 by the extent of the small area 10.

FIGS. 5 and 6 show perspective illustrations of semiconductor laser structures. The structures of these FIGS. 5 and 6 are based on cross-sections of FIGS. 1 and 3, respectively. Their essential feature is that non-absorbing mirrors are produced by the narrow strip 20 being shortened, symmetrically with the mirrors 11, 12, by the extent of the small area 10, and by the laser-active layer 4 simultaneously being highly doped ( $n > \sim 2 \cdot 10^{18}$ cm$^{-3}$).

Figure 7A:
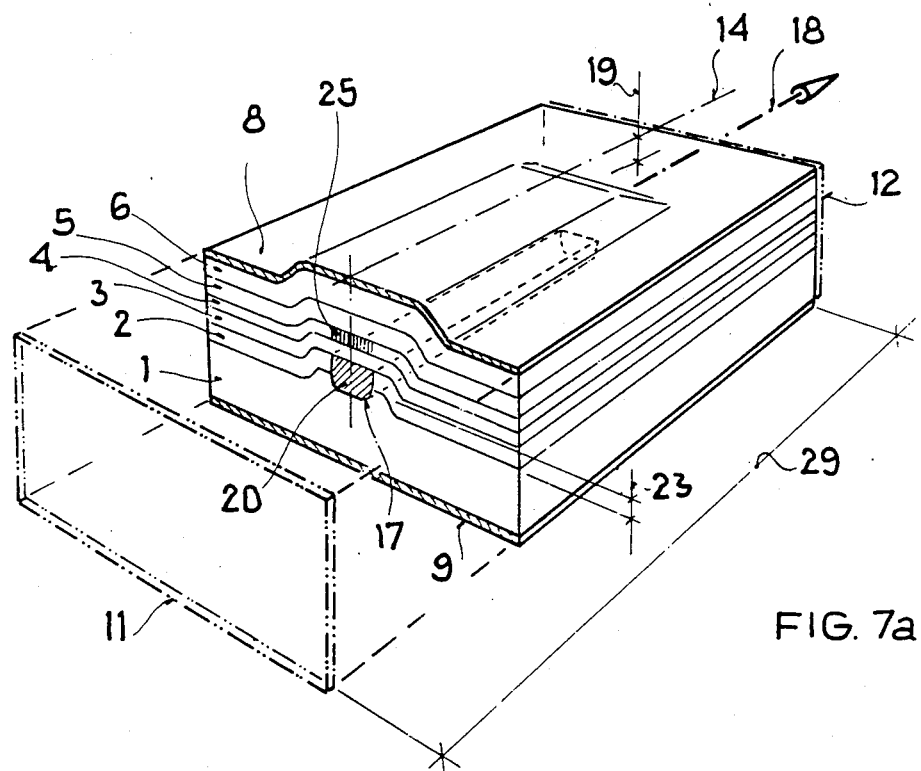
FIG. 7a is the perspective illustration of a heterostructure semiconductor laser diode wherein the narrow strip 20 extends at an incline immediately in front of the mirrors and on a lower level than the main plane of the laser-active layer 4.

In the semiconductor laser structure of FIG. 7a, the cross-section illustrated in perspective comprises, in the area of the plane of symmetry 14, an elevation 23 of trapezoidal configuration in the substrate 1 which extends in the longitudinal direction as far as the small area 15 immediately in front of the mirrors 11 and 12. At that point there is drop at an inclination of more than 45 degrees, and all of the epitaxial layers 2, 3, 4, 5, 6 applied to the thus formed substrate then extend into the mirrors 11 and 12, respectively, parallel to the lower side of the substrate or the main plane.

The narrow strip 20 is again produced by masking and diffusion, with the diffusion front 17 terminating by the extent of the small area 15 in front of the mirrors 11 and 12, respectively.

Figure 7B:
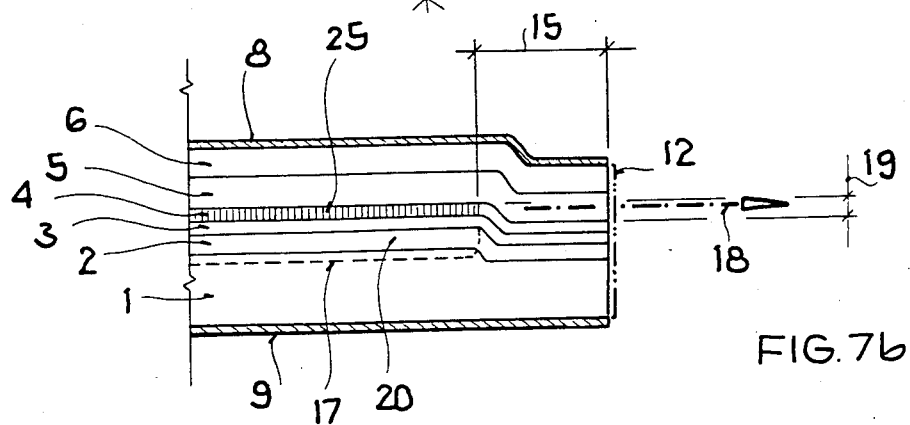

FIG. 7b shows part of a longitudinal section taken through the semiconductor laser structure of FIG. 7a. The laser beam 18 exits from the upper enclosing layer 5 out of the mirrors 11 and 12, respectively.

It is expedient for the offset 19 of the laser-active layer 4 to be approximately 2 μm in the area in front of the mirrors 11 and 12. In relation to the resonator length 29, the symmetrical shortening 10 of the narrow strip 20 or the small area 15 extending at an incline and offset from the main plane of the laser-active layer is approximately 5 to 15 μm and lies in the order of magnitude of two diffusion lengths of the charge carriers of the active layer 4.

Figure 8A:
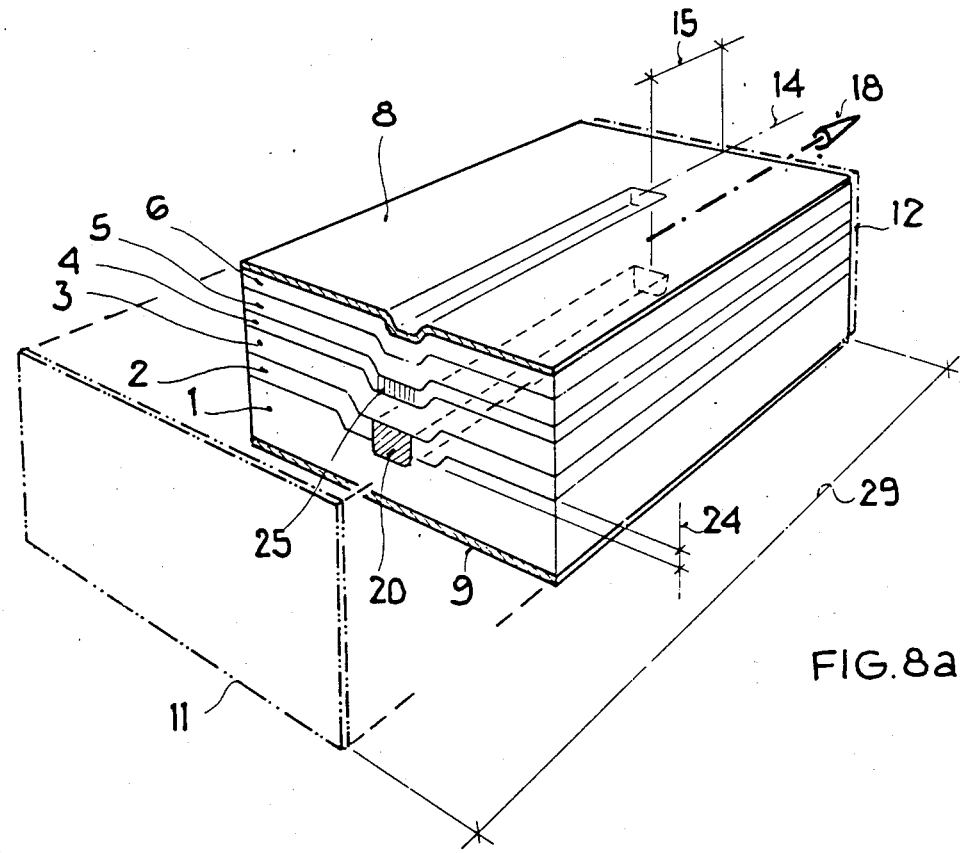
FIG. 8a is the perspective illustration of a heterostructure semiconductor laser diode with a cross-section according to FIG. 3, wherein the narrow strip 20 extends at an incline immediately in front of the mirrors and on a higher level than the main plane of the laser-active layer 4.
Figure 8B:
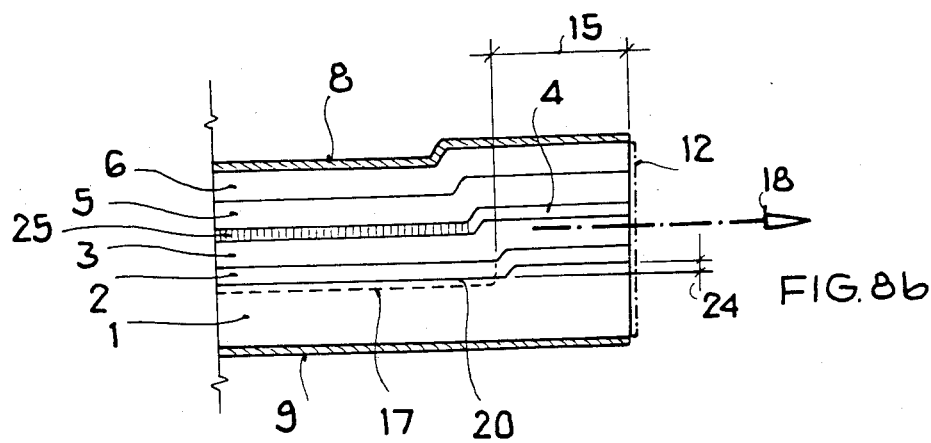

FIGS. 8a and 8b show a semiconductor laser structure design which is inverse to that of FIGS. 7a and 7b, respectively. The cross-section illustrated in perspective in FIG. 8a comprises in the area of the plane of symmetry 14 a recess 24 of trapezoidal configuration extending in the longitudinal direction as far as the small area 15 immediately in front of the mirrors 11 and 12. At that point there is an elevation at an inclination of more than 45 degrees, and all of the epitaxial layers applied to the thus formed substrate then extend into the mirrors 11 and 12, respectively, parallel to the lower side of the substrate or the main plane.

The narrow strip 20 is again produced by masking and, for example, diffusion, with the diffusion front 17 terminating in front of the mirrors 11 and 12, respectively, by the extent of the small area 15.

FIG. 8b shows part of a longitudinal section taken through the semiconductor laser structure of FIG. 8a. The laser beam 18 exits from the lower enclosing layer 3 out of the mirrors 11 and 12, respectively.

The substrate 1 of FIGS. 7a, 7b and 8a, 8b, respectively, may be produced by, for example, masking and etching.

Due to the inclination or the offset 19 of the laser-active layer 4 in relation to the main plane in the area 15 immediately in front of the mirrors 11, 12, the laser beam 18 is coupled out of the laser-active layer 4 into one of the enclosing layers 3 and 5, respectively, and penetrates the resonator mirrors 11 and 12 in the area of one of the two enclosing layers which, on account of their larger and gap, do not absorb any laser light.

What is claimed is:

1. In a heterostructure semiconductor laser diode having a sequence of layers formed on a substrate (1), with the sequence including a laser-active layer (4) arranged between upper and lower enclosing layers (3, 5) of respectively opposite conductivity types and a cover layer (6) disposed on the upper enclosing layer on the side of the sequence of layers facing away from the substrate, and further having respective ohmic electrical contacts for said cover layer and said substrate; the improvement wherein a further layer (2) of a conductivity type opposite to that of the substrate (1) is arranged between the substrate (1) and the lower enclosing layer (3) and comprises, in the area of the plane of symmetry (14), a narrow strip (20) produced by diffusion which has the same conductivity type as the substrate (1) and penetrates into the area of the substrate, whereby the current flowing in the forward direction of the semiconductor laser diode is restricted to a narrow strip-shaped area (25) of the laser-active layer (4) in the area of the plane of symmetry above said narrow strip.

2. Heterostructure semiconductor laser diode as defined in claim 1, wherein the area of the laser-active layer (4) relevant to the amplification is significantly shorter in its length-wise dimensions than the resonator length (29) of the semiconductor laser diode.

3. Heterostructure semiconductor laser diode as defined in claim 1, wherein the area of the laser-active layer(4) relevant to the amplification is shortened by the narrow strip (20) extending in its longitudinal extension in a small area (15) immediately in front of the two mirrors (11, 12) at an inclination to the main plane of the laser-active layer (4).

4. Heterostructure semiconductor laser diode as defined in claim 3, wherein the inclination extends at more than 45 degrees.

5. Heterostructure semiconductor laser diode as defined in claim 1, wherein the distance between the lower side of the laser-active layer (4) and the upper side of the narrow strip (20) in the area of the plane of symmetry (14) is greater than or equal to the layer thickness of the lower enclosing layer (3) in the area outside of the plane of symmetry (14).

6. Heterostructure semiconductor laser diode as defined in claim 1, wherein the substrate (1) in the area of the plane of symmetry (14) is recessed by an etching process.

7. Heterostructure semiconductor laser diode as defined in clam 1, wherein the substrate (1) is recessed in cross-section in the area of the plane of symmetry (14) and at edge zones by an etching process in order to obtain a levelling effect on the epitaxial layers during the subsequent epitaxy process.

8. Heterostructure semiconductor laser diode as defined in claim 3, wherein the laser-active layer (4) between the respective and inclinations mirrors again extends parallel to the main plane of the laser-active layer (4) up to the mirrors (11, 12).

9. Heterostructure semiconductor laser diode as defined in claim 1, wherein the substrate (1) is p-doped.

10. A heterostructure semiconductor laser diode as defined in claim 1 wherein said lower enclosing layer is of the same conductivity type as said substrate, and said cover layer is of the same conductivity type as said upper enclosing layer.

11. A heterostructure semiconductor laser diode as defined in claim 1, wherein the area of the laser-active layer (4) relevant to the amplification is shortened by the narrow strip (20) being shortened in its lengthwise dimensions symmetrically with respect to the mirrors (11, 12) defining the laser resonator length by a given extent, and said laser-active layer (4) is highly doped.

12. A heterostructure semiconductor laser diode as defined in claim 1, wherein said further layer arranged over said substrate (1) is recessed by an etching process in the area of the plane of symmetry (14).

13. A heterojunction semiconductor laser diode as defined in claim 1 wherein said narrow strip formed in said further layer is shorter in its lengthwise dimensions than said further layer and is disposed symmetrically between the two mirrors defining the laser resonator length so that it is spaced from each of the mirrors.

14. A heterostructure semiconductor laser diode as defined in claim 13 wherein said laser-active layer is highly doped.

15. A heterostructure semiconductor laser as defined in claim 14 wherein said substrate and said lower enclosing layer are of p-type conductivity, and said upper enclosing layer, said cover layer and said laser-active layer are of n-type conductivity.

16. A heterostructure semiconductor diode as defined in claim 13 wherein means are provided for causing a portion of said layers of said layer sequence disposed in the spaces between said narrow strip and each of the two mirrors to be inclined with respect to the main plane of said laser-active layer by an angle of more than 45 degrees.

17. A heterostructure semiconductor laser diode as defined in claim 16 wherein said means for causing includes an elevation formed on the upper surface of said substrate in the area of said plane of symmetry, with said elevation having a trapezoidal cross-section at least in the lengthwise direction and being spaced from both mirrors, and with the upper surface of said elevation underlying said narrow strip formed in said further layer and having a length corresponding substantially to the length of said narrow strip, whereby the portions of said layer sequence disposed in the spaces between said narrow strip and the mirrors are inclined downwardly over the ends of said elevation which face the mirrors and then extend parallel to the main plane of said laser-active layer to the respective mirrors.

18. A hetrostructure semiconductor laser diode as defined in claim 16 wherein said means for causing includes a recess formed in the upper surface of said substrate in the area of said plane of symmetry with said recess having a trapezodial cross section at least in the lengthwise direction and being spaced from both mirrors, and with said narrow strip being formed, entirely within the portion of said further layer disposed in said recess, whereby the portions of said layer sequence disposed in the spaces between said narrow strip and the mirrors are inclined upwardly over the end surfaces of said recess which face the mirrors and then extend parallel to the main plane of said laser-active layer to the respective mirrors.

19. A heterostructure semiconductor laser as defined in claim 13 wherein said narrow strip formed in said further layer is spaced from each of the mirrors by a distance in the order of magnitude of two diffusion lengths of the charge carriers of said laser-active layer.

* * * * *